(12) United States Patent
Alzheimer et al.

(10) Patent No.: US 12,003,252 B2
(45) Date of Patent: *Jun. 4, 2024

(54) ERROR CORRECTING CODE POISONING FOR MEMORY DEVICES AND ASSOCIATED METHODS AND SYSTEMS

(71) Applicant: Micron Technology, Inc., Boise, ID (US)

(72) Inventors: Joshua E. Alzheimer, Boise, ID (US); Randall J. Rooney, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/084,048

(22) Filed: Dec. 19, 2022

(65) Prior Publication Data

US 2023/0119341 A1    Apr. 20, 2023

Related U.S. Application Data

(63) Continuation of application No. 17/093,312, filed on Nov. 9, 2020, now Pat. No. 11,533,064.

(51) Int. Cl.
| | | |
|---|---|---|
| *H03M 13/00* | (2006.01) | |
| *G06F 11/10* | (2006.01) | |
| *H03M 13/01* | (2006.01) | |

(52) U.S. Cl.
CPC ....... *H03M 13/015* (2013.01); *G06F 11/1076* (2013.01)

(58) Field of Classification Search
None
See application file for complete search history.

(56) References Cited

U.S. PATENT DOCUMENTS

| | | | |
|---|---|---|---|
| 10,108,512 B2* | 10/2018 | Halbert | G06F 11/008 |
| 10,762,977 B1 | 9/2020 | Chang et al. | |
| 2010/0005375 A1* | 1/2010 | Dell | G06F 11/10 |
| | | | 714/E11.032 |
| 2012/0059958 A1* | 3/2012 | Hnatko | G06F 13/1673 |
| | | | 710/53 |
| 2012/0124251 A1* | 5/2012 | Hnatko | G11C 7/106 |
| | | | 710/29 |
| 2015/0186212 A1 | 7/2015 | Lin et al. | |
| 2015/0358036 A1 | 12/2015 | Tseng | |
| 2019/0042369 A1* | 2/2019 | Deutsch | G06F 3/0673 |
| 2021/0397366 A1 | 12/2021 | Lee et al. | |
| 2022/0149866 A1 | 5/2022 | Alzheimer et al. | |

* cited by examiner

*Primary Examiner* — Mujtaba M Chaudry
(74) *Attorney, Agent, or Firm* — Perkins Coie LLP (57) ABSTRACT

Memory devices, systems including memory devices, and methods of operating memory devices are described, in which memory devices are configured to poison data based on an indication provided by a host device coupled with the memory devices. The indication may include which one or more bits to poison (invert) at which stages of performing write or read operations. In some embodiments, the memory device may invert one or more bits according to the indication and then correct one or more errors associated with inverting the one or more bit to verify its on-die ECC functionality. In some embodiments, the memory device may provide the host device with poisoned data including one or more bits inverted according to the indication such that the host device may test system-level ECC functionality using the poisoned data.

20 Claims, 8 Drawing Sheets

ERROR CORRECTING CODE POISONING
FOR MEMORY DEVICES AND ASSOCIATED
METHODS AND SYSTEMS

CROSS-REFERENCE TO RELATED APPLICATION(S)

This application is a continuation of U.S. patent application Ser. No. 17/093,312, filed Nov. 9, 2020, which is incorporated herein by reference in its entirety.

TECHNICAL FIELD

The present disclosure generally relates to memory devices, and more particularly relates to error correcting code poisoning for memory devices and associated methods and systems.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and nonvolatile memory. Volatile memory, including random-access memory (RAM), static random-access memory (SRAM), dynamic random-access memory (DRAM), and synchronous dynamic random-access memory (SDRAM), among others, require a source of applied power to maintain its data. Nonvolatile memory, by contrast, can retain its stored data even when not externally powered. Nonvolatile memory is available in a wide variety of technologies, including flash memory (e.g., NAND and NOR), phase change memory (PCM), ferroelectric random-access memory (FeRAM), resistive random-access memory (RRAM), and magnetic random-access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

The present disclosure will be understood more fully from the detailed description given below and from the accompanying drawings of various embodiments of the disclosure. The components in the drawings are not necessarily to scale. Instead, emphasis is placed on illustrating clearly the principles of the present technology.

DETAILED DESCRIPTION

Methods, systems, and apparatuses for memory devices (e.g., DRAM) are disclosed, which provide for error correcting code poisoning. As memory cells scale to increase memory densities and storage capacities of memory devices, meeting various reliability criteria for the memory devices becomes ever more challenging. Error checking and correcting functions utilizing error correcting code (ECC) may help to circumvent certain reliability issues. In some embodiments, memory devices include an ECC circuit (which may be referred to as an ECC engine, module, block, or the like). For example, the ECC circuit included in the memory device ("on-die ECC circuit") may detect and correct at least one error (e.g., a valid logic state of "1" erroneously flipped to an invalid logic state of "0" or vice versa) in data. Additionally, or alternatively, the ECC circuit may detect two or more errors in the data. In some embodiments, a host device (e.g., a memory controller) coupled with the memory devices includes an ECC circuit external to the memory devices (e.g., system-level ECC functions). Being able to test the on-die ECC circuit and/or the system-level ECC functions would be desirable to confirm proper operations of the ECC circuits.

In some embodiments, on-die ECC circuits of the memory devices may be configured to correct at least one error to improve the data integrity within the memory devices. By way of example, the on-die ECC circuits may utilize data including a first quantity of bits (e.g., 128 data bits) to compute (calculate) an ECC parity code including a second quantity of bits (e.g., 8 bits), which may be referred to as ECC check bits or ECC parity bits. A combination of the first and second quantities of bits (e.g., 136 bits including the 128 data bits plus the 8 ECC check bits) may be referred to as a code word including a third quantity of bits (e.g., 136 bits).

During write operations, the memory device, upon receiving a write command providing the data and an address within a memory array of the memory device, may compute a set of ECC check bits (e.g., 8 bits, a first group of check bits) using the data (e.g., 128 bits of data) and then writes the code word (e.g., 136 bits including the data and the ECC check bits) to the address within the memory array. During read operations, the memory device may attempt to detect and/or correct at least one error before transmitting the data (e.g., 128 bits of data) to the memory controller. In some embodiments, the memory device reads the code word from the address, and compute another set of ECC check bits (e.g., 8 bits, a second group of check bits) using the data read from the address. Subsequently, the memory device may compare the first group of ECC check bits read from the address (which has been written to the address in response to the write command) with the second group of ECC check bits computed from the data read from the address such that the memory device can detect and/or correct at least one error in the data.

The on-die ECC circuits may be tested under manufacturing environments in various ways. For example, data may be written to a memory array with the on-die ECC circuit disabled (e.g., via test modes), and then read from the memory array with the ECC circuit enabled, or vice versa. In other examples, with the on-die ECC circuit enabled, valid data may be written to the memory array and then read back. Subsequently, poisoned data (e.g., one or more data bits intentionally inverted or flipped, one or more errors injected to the data) may be written and then read back to validate the on-die ECC circuit functionality. Once the memory devices are implemented in a system, however, accessing test modes and/or manipulating the data by injecting errors may not be available to the system (e.g., a host device, a memory controller) to test the on-die ECC functionality. Additionally, or alternatively, being able to provide poisoned data to the host device may be desirable to test the system-level ECC functionality.

Several embodiments of the present technology are directed to poisoning one or more bits of data (e.g., inverting, flipping, modifying, corrupting, or the like) within a memory device included in a system. Such poisoning of data may facilitate confirming functionality of the on-die ECC circuit and/or providing (outputting) poisoned data for testing the system-level ECC functionality. In this regard, the present technology allows a host device of the system, in conjunction with the memory device coupled therewith, to control which bits to invert (to poison) during write or read operations. In some embodiments, the host device may access one or more mode registers of the memory device to indicate (program) which bit or bits to poison while executing an access command (e.g., a write command, a read command). Additionally, or alternatively, the host device may transmit one or more commands configured to program the registers (e.g., multi-purpose commands (MPCs), mode register write (MRW) commands) to provide such indications to the memory device.

A memory device that supports embodiments of the present technology is described with reference to FIG. 1. More detailed descriptions of a memory device that supports embodiments of the present technology are provided with reference to FIGS. 2A through 2D. A memory system including a memory device in accordance with embodiments of the present technology is described with reference to FIG. 3. Methods of operating the memory device in accordance with embodiments of the present technology is described with reference to FIGS. 4 and 5.

Figure 1:
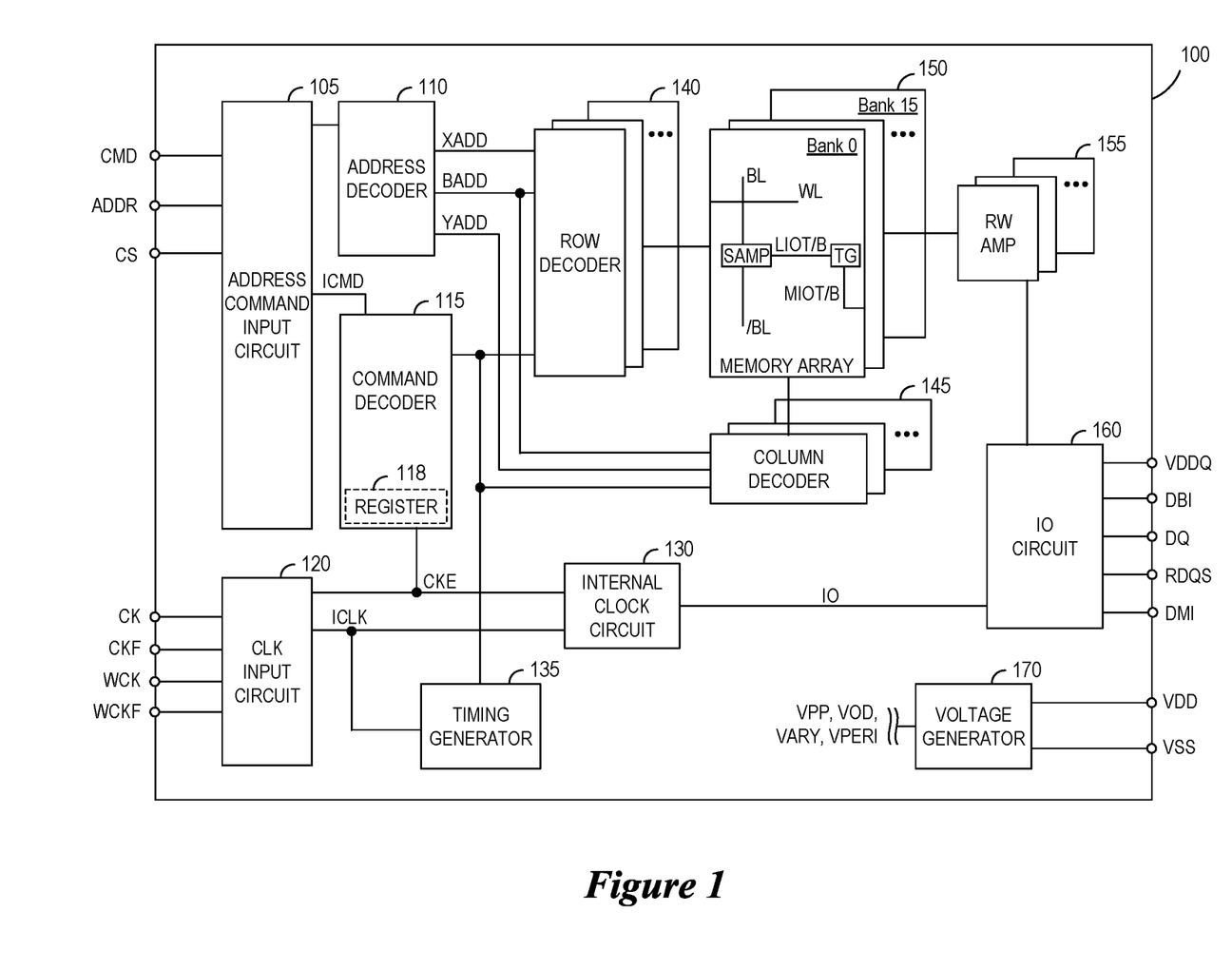
FIG. 1 is a block diagram schematically illustrating a memory device that supports embodiments of the present technology.

FIG. 1 is a block diagram schematically illustrating a memory device 100 in accordance with embodiments of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells (e.g., m×n memory cells) arranged at intersections of the word lines (e.g., m word lines, which may also be referred to as rows) and the bit lines (e.g., n bit lines, which may also be referred to as columns). Each word line of the plurality may be coupled with a corresponding word line driver (WL driver) configured to control a voltage of the word line during memory operations.

Memory cells can include any one of a number of different memory media types, including capacitive, phase change, magnetoresistive, ferroelectric, or the like. In some embodiments, a portion of the memory array 150 may be configured to store ECC parity bits (ECC check bits). The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least one respective main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI (for data bus inversion function), and DMI (for data mask inversion function), power supply terminals VDD, VSS, and VDDQ.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140 (which may be referred to as a row driver), and a decoded column address signal (YADD) to the column decoder 145 (which may be referred to as a column driver). The address decoder 110 can also receive the bank address portion of the ADDR input and supply the decoded bank address signal (BADD) and supply the bank address signal to both the row decoder 140 and the column decoder 145.

The command and address terminals may be supplied with command signals CMD, address signals ADDR, and chip select signals CS, from a memory controller. The command signals may represent various memory commands from the memory controller (e.g., refresh commands, activate commands, precharge commands, access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105.

The command decoder 115 may include circuits to decode the internal command signals ICMD to generate various internal signals and commands for performing memory operations, for example, a row command signal to select a word line and a column command signal to select a bit line. Other examples of memory operations that the memory device 100 may perform based on decoding the internal command signals ICMD includes a refresh command (e.g., re-establishing full charges stored in individual memory cells of the memory array 150), an activate command (e.g., activating a row in a particular bank, in some cases for subsequent access operations), or a precharge command (e.g., deactivating the activated row in the particular bank). The internal command signals can also include output and input activation commands, such as clocked command CMDCK (not shown in FIG. 1).

The command decoder 115, in some embodiments, may further include one or more registers 118 for tracking various counts and/or values (e.g., counts of refresh commands received by the memory device 100 or self-refresh operations performed by the memory device 100) and/or for storing various operating conditions for the memory device 100 to perform certain functions, features, and modes (or test modes). As such, in some embodiments, the registers 118 (or a subset of the registers 118) may be referred to as mode registers. Additionally, or alternatively, the memory device 100 may include registers 118 as a separate component out of the command decoder 115. In some embodiments, the registers 118 may include multi-purpose registers (MPRs) configured to write and/or read specialized data to and/or from the memory device 100.

When a read command is issued to a bank with an open row and a column address is timely supplied as part of the read command, read data can be read from memory cells in the memory array 150 designated by the row address (which may have been provided as part of the activate command identifying the open row) and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (e.g., the register 118). The read latency information RL can be defined in terms of clock cycles of the CK clock signal. For example, the read latency information RL can be a number of clock cycles of the CK signal after the read command is received by the memory device 100 when the associated read data is provided.

When a write command is issued to a bank with an open row and a column address is timely supplied as part of the write command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (e.g., register 118). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command decoder 115.

For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

In some embodiments, the memory device 100 includes an on-die ECC circuit (not shown). During write operations, the on-die ECC circuit can compute a first group of ECC check bits utilizing data (e.g., external data) provided to the memory device 100 to generate a code word including the data and the first group of ECC check bits. The memory device 100, then writes the code word to the memory array 150 to complete the write operations. During read operations, the on-die ECC circuit can read the code word to compute a second group of ECC check bits utilizing the data (e.g., external data) read from the memory array 150 such that the on-die ECC circuit can compare the first set of ECC check bits with the second set of ECC check bits. In this manner, the on-die ECC circuit may detect and/or correct one or more errors in the data read from the memory array 150.

In some embodiments, the memory device 100 may receive a command directed to a first data set from a host device coupled with the memory device 100. The first data set may refer to external data that the host provides (if the command corresponds to a write command) or the external data written in the memory array 150 (if the command corresponds to a read command). The memory device 100 may generate a second data set from the first data set, where the second data set includes one or more bits inverted (e.g., corrupted, poisoned) corresponding to one or more bit locations that the host device has indicated to the memory device 100 (e.g., via multi-purpose commands, MRW commands, or any command which writes the registers 118 of the memory device 100). The second data set may refer to the code word generated based on the external data (if the command corresponds to a write command) or the code word read from the memory array (if the command corresponds to the read command). Subsequently, the memory device 100, in conjunction with the on-die ECC circuit, may detect one or more errors based on the one or more bits inverted in the second data set. Subsequently, the memory device 100, in conjunction with the on-die ECC circuit, may correct the one or more errors, thereby generating the first data set with the poison removed, and transmit the first data set to the host device. In this manner, the host device may test the on-die ECC circuit to validate (confirm) its functionality, by controlling which bits to poison during write operations or read operations, and receiving the data without the poison from the memory device 100.

Figure 2A:
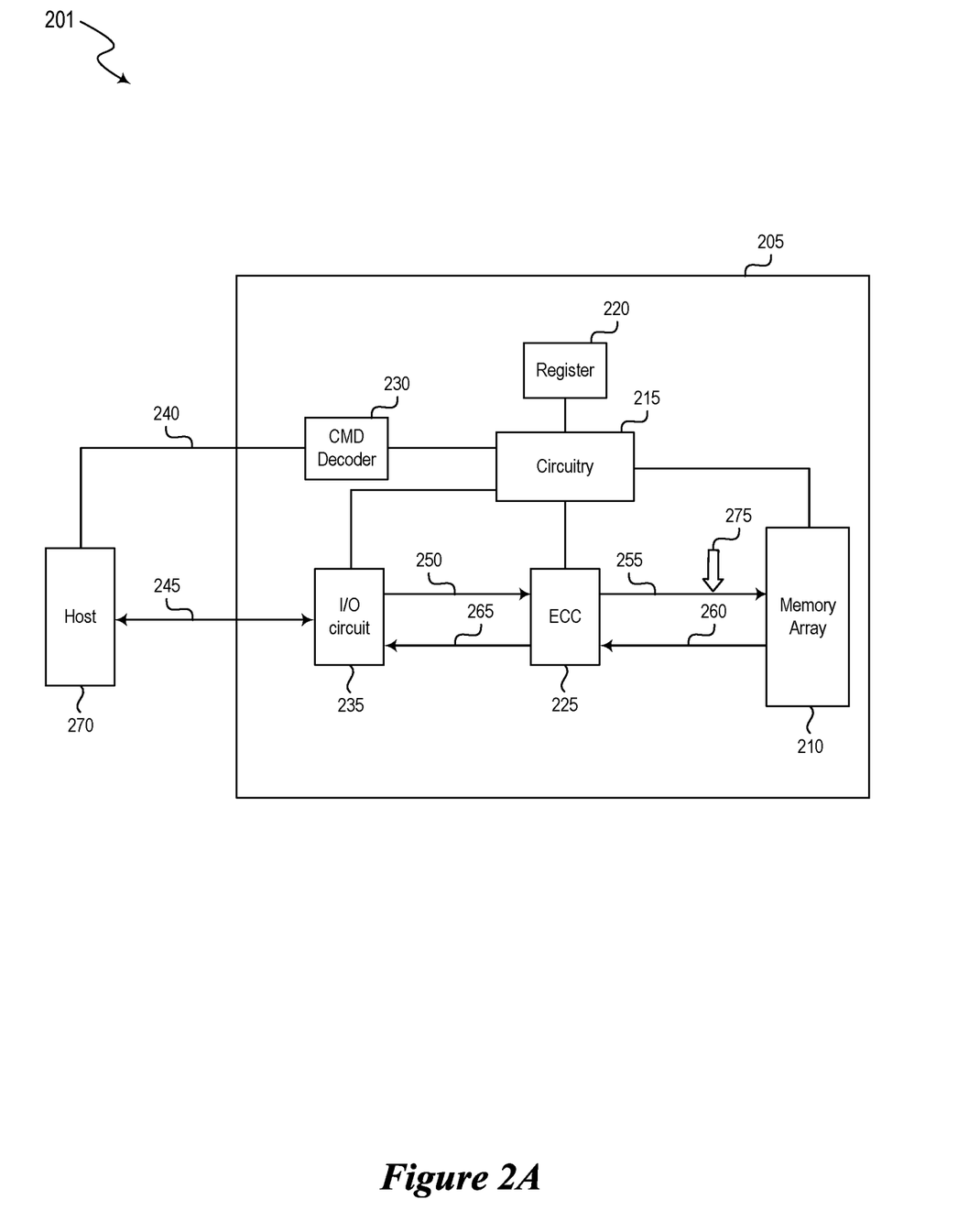
FIGS. 2A through 2D are block diagrams schematically illustrating a memory device in accordance with embodiments of the present technology.

FIG. 2A is a block diagram 201 schematically illustrating a memory device 205 (which may be an example of or include aspects of the memory device 100) in accordance with embodiments of the present technology. The diagram 201 depicts a host device 270 (e.g., a memory controller) coupled with the memory device 205. The memory device 205 may include peripheral circuitry 215 coupled with a memory array 210 (which may be an example of or include aspects of the memory array 150), a register 220 (which may be an example of or include aspects of the register 118), an ECC circuit 225, a command decoder 230 (which may be an example of or include aspects of the command decoder 115), an I/O circuit 235 (which may be an example of or include aspects of the input/output circuit 160), among others.

The diagram 201 further illustrates various channels (buses, paths) that carry different signals (e.g., command signals, data signals). For example, the diagram 201 depicts command/address bus 240 (which may include aspects of CMD, ADDR, and CS described with reference to FIG. 1), through which the host device 270 may transmit various commands (e.g., access commands, multi-purpose commands, MRW commands) to the memory device 205. In addition, the host device 270 may transmit and/or receive data through input/output (I/O) bus 245 (which may include aspects of the data terminals DQ and data clock terminals described with reference to FIG. 1). The diagram 201 illustrates, for write operations, a data path 250 before the ECC circuit 225 and a data path 255 after the ECC circuit 225. Further, the diagram 201 illustrates, for read operations, a data path 260 before the ECC circuit 225 and a data path 265 after the ECC circuit 225.

The register 220 may be configured to include one or more bit locations based on an indication from the host device 270. In this regard, the host device 270 may predetermine the one or more bit locations and access the memory device 205 to program the register 220 such that the host device 270 can test functionality of the ECC circuit 225 or can have the memory device 205 to provide (output) poisoned data to the host device to test system-level ECC functionality. The indication from the host device 270 may include stages of operations where the poisoning may occur—e.g., during write operations before or after the ECC circuit 225, during read operations before or after the ECC circuit 225. Although the block diagram 201 depicts the register 220 as a single block, the register 220 may include multiple registers (e.g., mode registers, multi-purpose registers).

The host device 270 may provide the indication to the memory device 205 by transmitting one or more commands to program the register 220 (e.g., multi-purpose commands, MRW commands). As such, the command decoder 230 may be configured to determine the one or more bit locations (and the stages of operation where the poisoning to occur) predetermined by the host device 270 based on the one or more multi-purpose commands (and/or one or more MRW commands) transmitted from the host device via the command/address bus 240. In some embodiments, the host device 270 may provide the indication to the memory device 205 by programming the register 220, as well as transmitting one or more multi-purpose commands (and/or one or more MRW commands).

The ECC circuit 225 may be configured, during write operations, to compute a first group of ECC check bits utilizing data (e.g., external data) provided to the memory device 205 to generate a code word including the data and the first group of ECC check bits. During read operations, the ECC circuit 225 can read the code word from the memory array 210 to compute a second group of ECC check bits utilizing the data (e.g., external data) read from the memory array 210 such that the ECC circuit 225 can compare the first set of ECC check bits with the second set of ECC check bits. In this manner, the on-die ECC circuit may detect and/or correct one or more errors in the data read from the memory array 210.

In some cases, the host device 270 can test the memory device 205 to confirm (validate) the on-die ECC functionality through a write command followed by a read command. For example, the host device 270 may indicate the memory device 205 one or more bit locations to invert (poison, corrupt) during write operations. As described above, the host device 270 may access the register 220 (e.g., through the peripheral circuitry 215) to program one or more bit locations to invert during write operations, prior to transmitting the write command. In some embodiments, the host device 270 may transmit one or more multi-purpose commands (and/or one or more MRW commands) to indicate the one or more bit locations before transmitting the write command. In this manner, the host device 270 can control (designate) memory device 205 as to which bits to invert during the write operations that the memory device 205 would perform, in response to receiving the write command that provides data (external data) and an address of the memory array 210 to write the data.

In some embodiments, the peripheral circuitry 215 may receive a write command (e.g., through the command/address bus 240) directed to external data (e.g., a first data set, 128-bit external data through the I/O bus 245) from the host device 270. The peripheral circuitry 215 may, in conjunction with the I/O circuit 235, bring the external data on the data path 250. The ECC circuit 225 may calculate a first group of ECC check bits using the external data to generate a code word including the external data and the first group of ECC check bits. The peripheral circuitry 215 can invert (poison, corrupt) one or more bits of the code word corresponding to the one or more bit locations that have been indicated to the memory device 205 by the host device 270. In this manner, the peripheral circuitry 215 may "poison" the code word (e.g., generating a second data set including one or more bits inverted) in accordance with the indication provided by the host device 270. The diagram 201 illustrates the poisoning with an arrow 275 on the data path 255. As a result of the poisoning, the data path 255 carries the "poisoned" code word such that the peripheral circuitry 215 can write the "poisoned" code word to the address of the memory array 210.

Subsequently, the host device 270 may transmit to the memory device 205 a read command including the address of the memory array 210. The peripheral circuitry 215 may read the "poisoned" code word from the memory array 210. As a result of reading the "poisoned" code word, the data path 260 provides the "poisoned" code word to the ECC circuit 225. The peripheral circuitry 215, in conjunction with the ECC circuit 225, may detect one or more errors in the "poisoned" code word (e.g., the second data set including one or more bits inverted). In some embodiments, the ECC circuit 225 may compute a second group of ECC check bits using the code word read from the memory array 210 (e.g., external data portion of the code word) and compare the second group of ECC check bits with the first group of ECC check bits of the code word. The peripheral circuitry 215, in conjunction with the ECC circuit 225, may correct the one or more errors from the "poisoned" code word. In this manner, the peripheral circuitry 215 can generate the external data from the "poisoned" code word read from the memory array 210. As a result of correcting the one or more errors from the "poisoned" code word, the data path 265 may provide the I/O circuit 235 with the external data that the host device 270 has provided with the write command, despite the poisoning of the external data—e.g., the data transmitted to the host device 270 via the data path 265 includes bits that match the data received from the host device 270 via the data path 250. Thereafter, the peripheral circuitry 215 can transmit the external data back to the host device 270 through the I/O bus 245. In this manner, the host device 270 can confirm (validate, verify) the on-die ECC functionality.

Figure 2B:
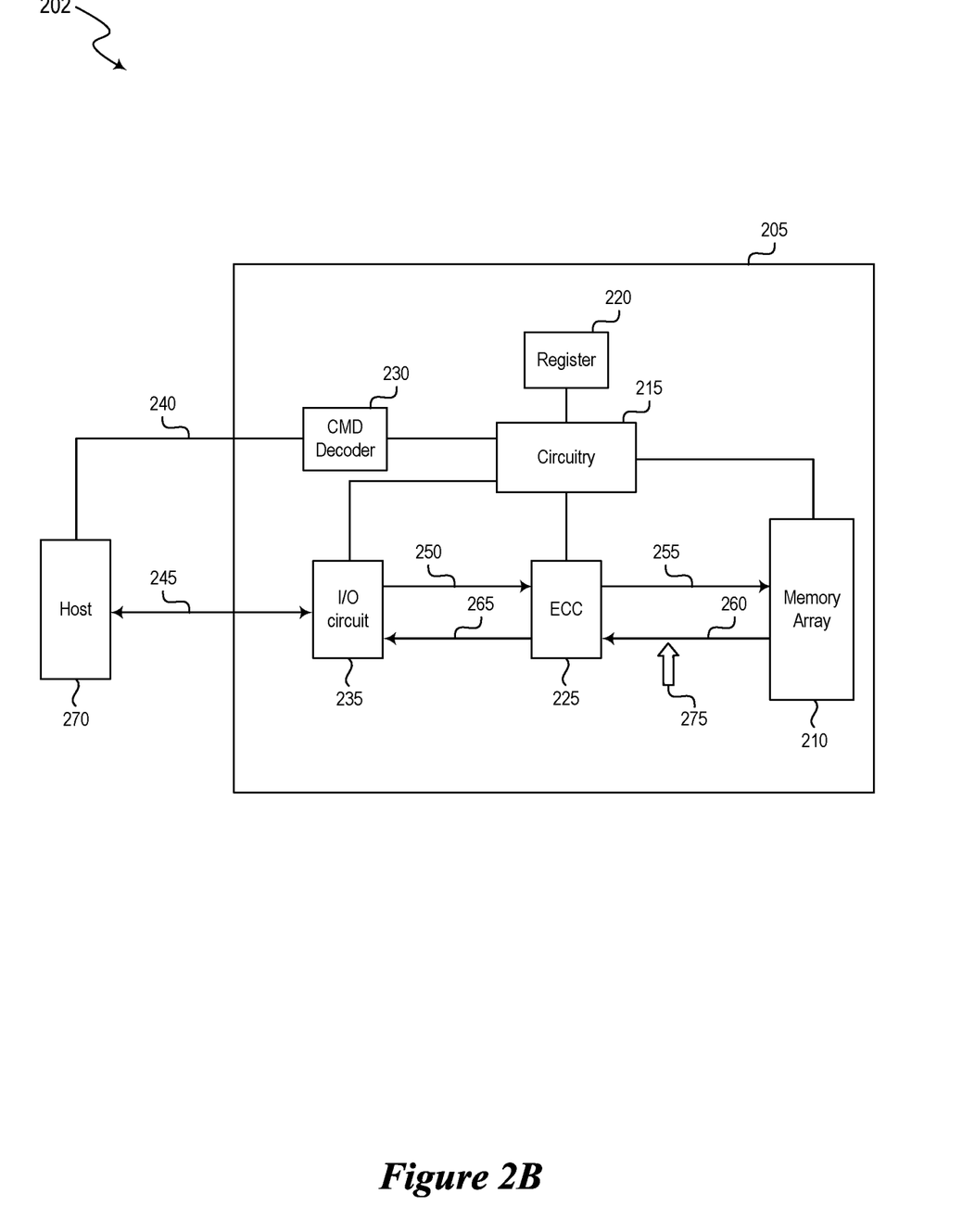

FIG. 2B is a block diagram 202 schematically illustrating the memory device 205. The diagram 202 describes that the host device 270 can test the memory device 205 to confirm (validate) the on-die ECC functionality through a read command. As described herein, the host device 270 may have indicated the memory device 205 one or more bit locations to invert (poison, corrupt) during read operations—e.g., by programming the register 220, by transmitting MPCs (and/or MRW commands) to the memory device 205, or both. As such, the host device 270 can control (designate) memory device 205 as to which bits to invert (poison, corrupt) during read operations that the memory device 205 would perform, in response to receiving the read command that reads data from an address of the memory array 210.

In some embodiments, the peripheral circuitry 215 may receive a read command (e.g., through the command/address bus 240) directed to data (e.g., a first data set, 128-bit data) written in an address of the memory array 210. In this regard, the host device 270 may have written a code word associated with the data to the address—e.g., the code word including the data and a first group of ECC check bits calculated using the data. As such, the peripheral circuitry 215 may read the code word from the address, and invert (poison, corrupt) one or more bits of the code word read from the memory array 210 (e.g., one or more bits of the data read from the memory array 210), where the one or more bits corresponds to the one or more bit locations that have been indicated to the memory device 205 by the host device 270. In this manner, the peripheral circuitry 215 may "poison" the code word (e.g., generating a second data set including one or more bits inverted) in accordance with the indication provided by the host device 270. The diagram 202 illustrates the poisoning with an arrow 275 denoted on the data path 260. As a result of the poisoning, the data path 260 carries the "poisoned" code word such that the ECC circuit 225 receives the "poisoned" code word.

The ECC circuit 225 may calculate a second group of ECC check bits using the "poisoned" code word (e.g., using the data including one or more bits inverted). Further, the ECC circuit 225 may compare the first group of ECC check bits with the second group of ECC check bits. In this manner, the ECC circuit 225 may detect one or more errors in the "poisoned" code word, and correct the one or more errors from the "poisoned" code word. As a result of correcting the one or more errors from the "poisoned" code word, the data path 265 may provide the I/O circuit 235 with the data written in the memory array 210, despite the poisoning of the data read from the memory array 210. Thereafter, the peripheral circuitry 215 can transmit the data to the host device 270 through the I/O bus 245. In this manner, the host device 270 can confirm (validate, verify) the on-die ECC functionality.

Figure 2C:
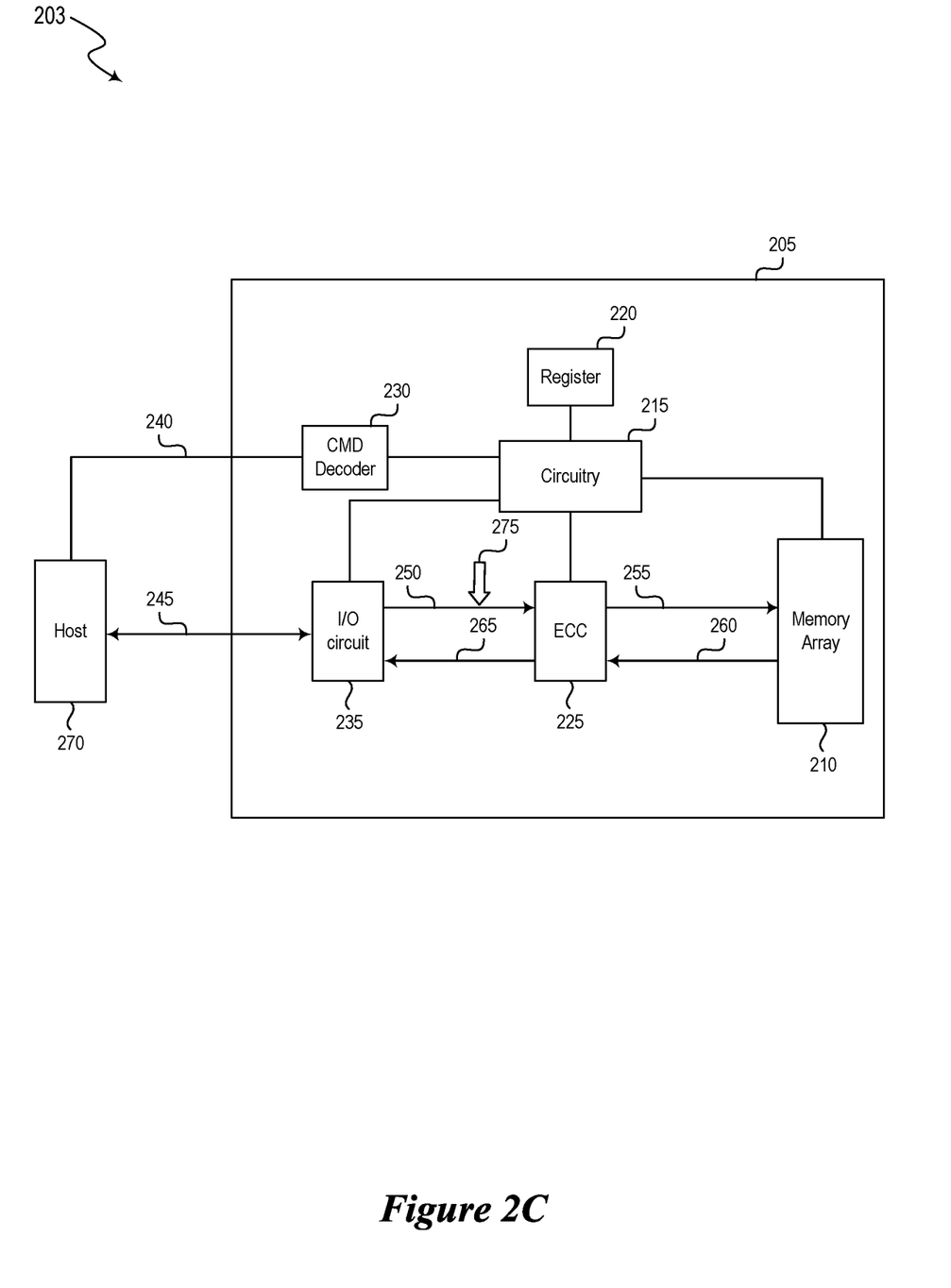

FIG. 2C is a block diagram 203 schematically illustrating the memory device 205. The diagram 203 describes that the host device 270 may cause the memory device 205 to poison external data during write operations such that the host device 270 may receive the poisoned external data from the memory device 205. In this manner, the host device 270 may test (confirm, validate) the system-level ECC functionality using the poisoned data received from the memory device 205. As described herein, the host device 270 may have indicated the memory device 205 one or more bit locations to invert (poison, corrupt) during the write operations—e.g., by programming the register 220, by transmitting MPCs (and/or MRW commands) to the memory device 205, or both. As such, the host device 270 can control (designate) memory device 205 as to which bits to invert during the write operations that the memory device 205 would perform, in response to receiving the write command that provides external data and an address of the memory array 210 to write the external data.

In some embodiments, the peripheral circuitry 215 may receive a write command (e.g., through the command/address bus 240) directed to external data (e.g., a first data set, 128-bit external data through the I/O bus 245) from the host device 270. The peripheral circuitry 215 may, in conjunction with the I/O circuit 235, bring the first data set on to the data path 250. The peripheral circuitry 215 can invert one or more bits of the external data corresponding to the one or more bit locations that have been indicated to the memory device 205 by the host device 270. In this manner, the peripheral circuitry 215 may "poison" the external data in accordance with the indication provided by the host device 270. The diagram 203 illustrates the poisoning with an arrow 275 on the data path 250. As a result of the poisoning, the data path 250 provides the "poisoned" external data to the ECC circuit 225. The ECC circuit 225 may calculate a first group of ECC check bits using the "poisoned" external data to generate a code word including the "poisoned" external data and the first group of ECC check bits. The peripheral circuitry 215 may write the code word to the address of the memory array 210, where the address is included in the write command.

Thereafter, the host device 270 may transmit to the memory device 205 a read command including the address of the memory array 210. The peripheral circuitry 215 may read the code word from the memory array 210. As a result of reading the code word, the data path 260 provides the ECC circuit 225 with the code word that includes the "poisoned" external data and the first group of ECC check bits. The ECC circuit 225 may calculate a second group of ECC check bits using the "poisoned" external data read from the memory array 210. Further, the ECC circuit 225 may compare the first group of ECC check bits read from the memory array 210 with the second group of ECC check bits. As both the first and second groups of ECC check bits are computed from the "poisoned" external data, the ECC circuit 225 may not detect any error from the "poisoned" external data read from the memory array 210. As such, the data path 265 may provide the "poisoned" external data to the I/O circuit 235. The peripheral circuitry 215 can transmit the "poisoned" external data to the host device 270 through the I/O bus 245. In this manner, the host device 270 can received the "poisoned" data from the memory device 205 such that the host device 270 can confirm (validate, verify) the system-level ECC functionalities using the "poisoned" data.

Figure 2D:
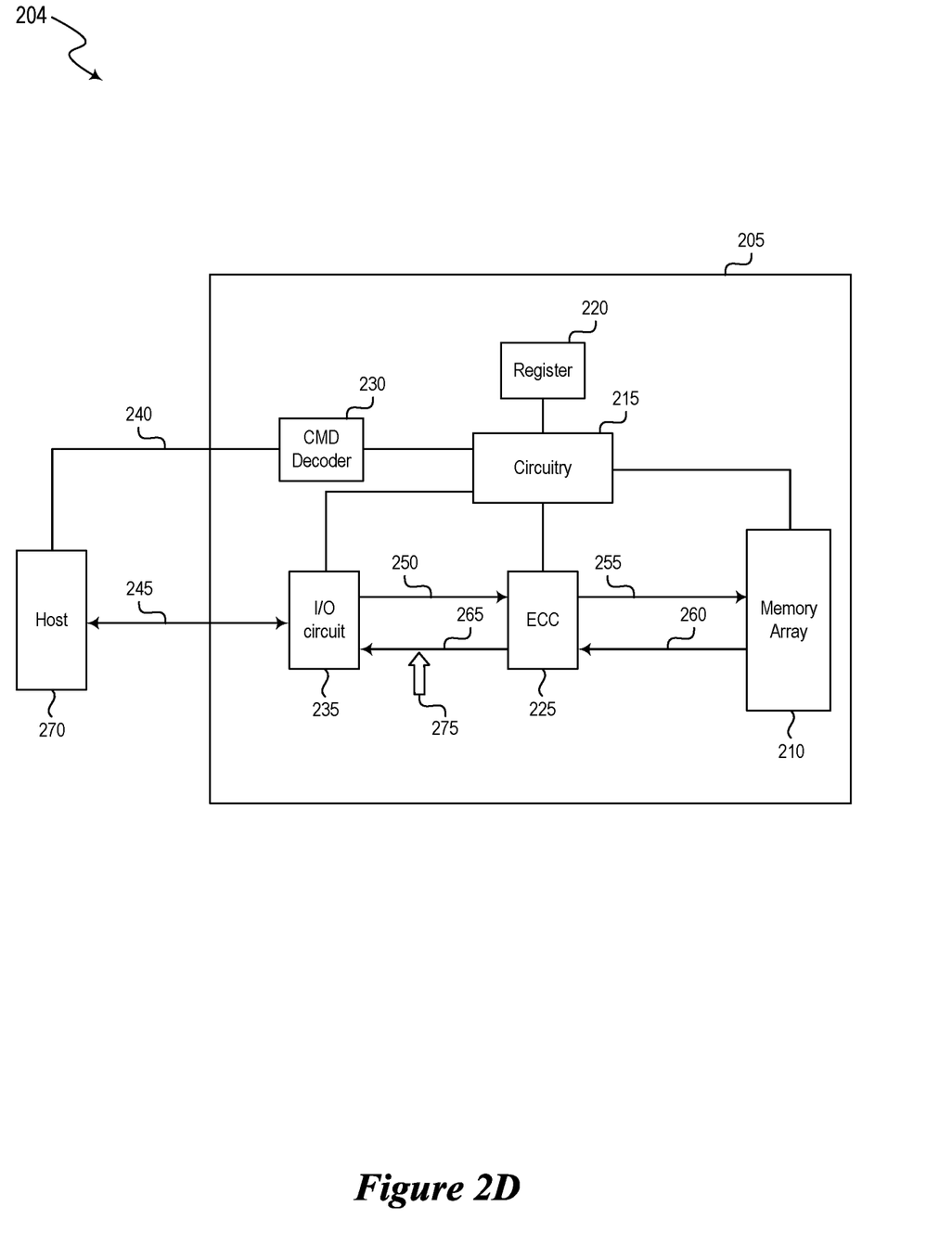

FIG. 2D is a block diagram 204 schematically illustrating the memory device 205. The diagram 204 describes that the host device 270 may cause the memory device 205 to poison data during read operations such that the host device 270 may receive the poisoned data from the memory device 205. In this manner, the host device 270 may test (confirm, validate) the system-level ECC functionality using the poisoned data received from the memory device 205. As described herein, the host device 270 may have indicated the memory device 205 one or more bit locations to invert (poison, corrupt) during the read operations—e.g., by programming the register 220, by transmitting MPCs (and/or MRW commands) to the memory device 205, or both. As such, the host device 270 can control (designate) memory device 205 as to which bits to invert during the read operations that the memory device 205 would perform, in response to receiving the read command providing an address of the memory array 210.

In some embodiments, the peripheral circuitry 215 may receive a read command (e.g., through the command/address bus 240) directed to the data (e.g., a first data set, 128-bit data) written to an address of the memory array 210. In this regard, the host device 270 may have written a code word associated with the data to the address—e.g., the code word including the data and a first group of ECC check bits calculated using the data. The peripheral circuitry 215 may bring the data out to the data path 265 after the ECC circuit 225 checks for errors in the code word read from the address—e.g., calculating a second group of ECC check bits using the data read from the memory array 210, comparing the first and second groups of ECC check bits. As both the first and second groups of ECC check bits are calculated based on the data, the ECC circuit 225 may not detect any error from the code word read from the memory array 210.

The peripheral circuitry 215 can invert one or more bits of the data corresponding to the one or more bit locations that have been indicated to the memory device 205 by the host device 270. In this manner, the peripheral circuitry 215 may "poison" the data in accordance with the indication provided by the host device 270, prior to transmitting the data to the host device 270. The diagram 204 illustrates the poisoning with an arrow 275 on the data path 265. As a result of the poisoning, the data path 265 provides the "poisoned" data to the I/O circuit 235. The peripheral circuitry 215 can transmit the "poisoned" data to the host device 270 through the I/O bus 245. In this manner, the host device 270 can received the "poisoned" data from the memory device 205 such that the host device 270 can confirm (validate, verify) the system-level ECC functionalities using the "poisoned" data.

Figure 3:
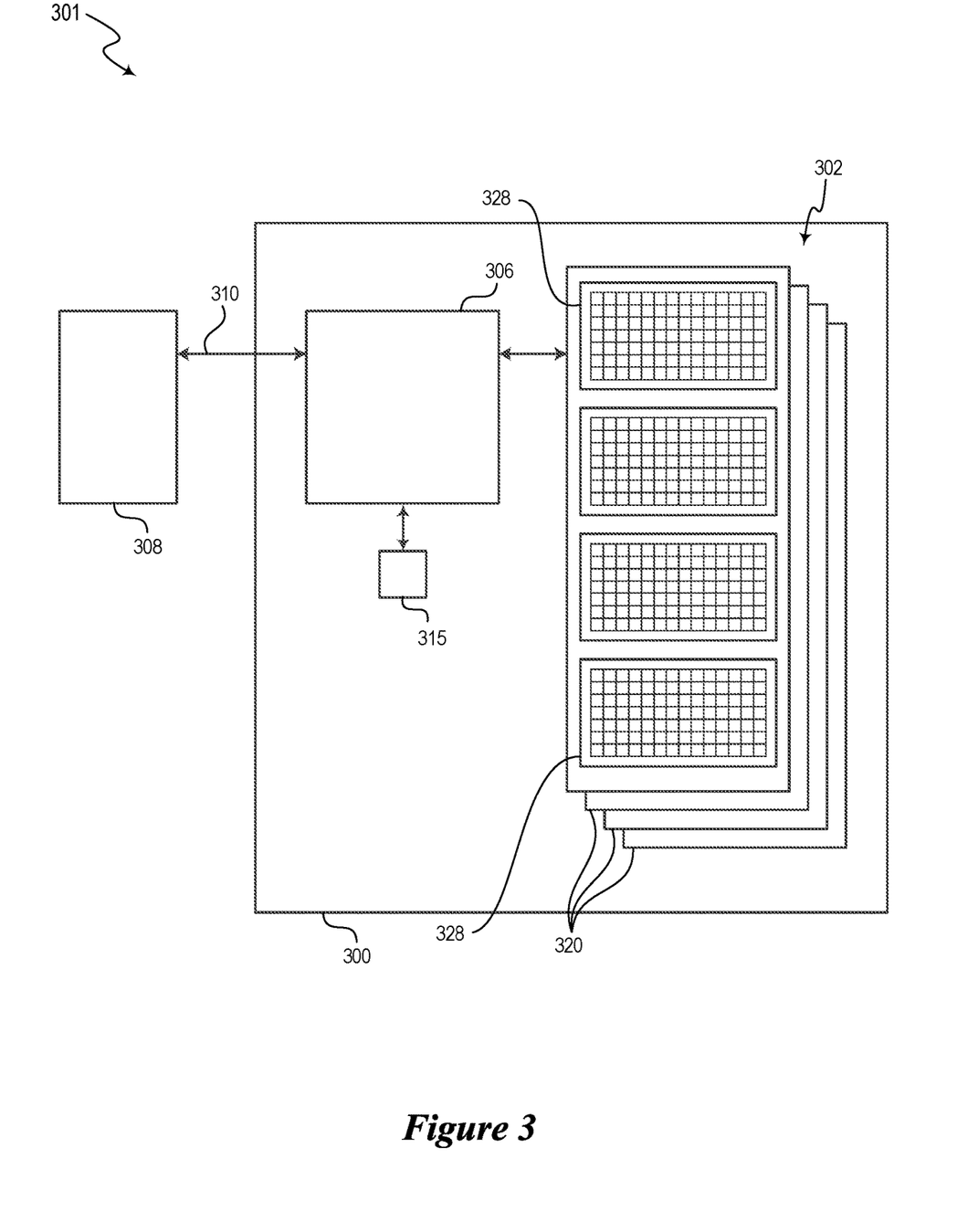
FIG. 3 is a block diagram of a system having a memory device configured in accordance with embodiments of the present technology.

FIG. 3 is a block diagram of a system 301 having a memory device 300 configured in accordance with embodiments of the present technology. The memory device 300 may be an example of or include aspects of the memory device described with reference to FIGS. 1 and 2A through 2D. As shown, the memory device 300 includes a main memory 302 (e.g., DRAM, NAND flash, NOR flash, FeRAM, PCM, etc.), a register 315, and control circuitry 306 operably coupled to a host device 308 (e.g., an upstream central processor (CPU), a memory controller). The register 315 may be an example of or include aspects of the registers 118 and/or the register 220. The control circuitry 306 may include aspects of various components described with reference to FIGS. 1 and 2A through 2D. For example, the control circuitry 306 may include aspects of the command/address input circuit 105, the address decoder 110, the command decoder 115 and/or 230, the ECC circuit 225, the peripheral circuitry 215, among others.

The main memory 302 includes a plurality of memory units 320, which each include a plurality of memory cells. The memory units 320 can be individual memory dies, memory planes in a single memory die, a stack of memory dies vertically connected with through-silicon vias (TSVs), or the like. For example, in one embodiment, each of the memory units 320 can be formed from a semiconductor die and arranged with other memory unit dies in a single device package. In other embodiments, multiple memory units 320 can be co-located on a single die and/or distributed across multiple device packages. The memory units 320 may, in some embodiments, also be sub-divided into memory regions 328 (e.g., banks, ranks, channels, blocks, pages, etc.).

The memory cells can include, for example, floating gate, charge trap, phase change, capacitive, ferroelectric, magnetoresistive, and/or other suitable storage elements configured to store data persistently or semi-persistently. The main memory 302 and/or the individual memory units 320 can also include other circuit components, such as multiplexers, decoders, buffers, read/write drivers, address registers, data out/data in registers, etc., for accessing and/or programming (e.g., writing) the memory cells and other function, such as for processing information and/or communicating with the control circuitry 306 or the host device 308. Although shown in the illustrated embodiments with a certain number of memory cells, rows, columns, regions, and memory units for purposes of illustration, the number of memory cells, rows, columns, regions, and memory units can vary, and can, in other embodiments, be larger or smaller in scale than shown in the illustrated examples. For example, in some embodiments, the memory device 300 can include only one memory unit 320. Alternatively, the memory device 300 can include two, three, four, eight, ten, or more (e.g., 16, 32, 64, or more) memory units 320. Although the memory units 320 are shown in FIG. 3 as including four memory regions 328 each, in other embodiments, each memory unit 320 can include one, two, three, eight, or more (e.g., 16, 32, 64, 100, 128, 256, or more) memory regions.

In one embodiment, the control circuitry 306 can be provided on the same die as the main memory 302 (e.g., including command/address/clock input circuitry, decoders, voltage and timing generators, input/output circuitry, etc.). In another embodiment, the control circuitry 306 can be a microcontroller, special purpose logic circuitry (e.g., a field programmable gate array (FPGA), an application specific integrated circuit (ASIC), control circuitry on a memory die, etc.), or other suitable processor. In one embodiment, the control circuitry 306 can include a processor configured to execute instructions stored in memory to perform various processes, logic flows, and routines for controlling operation of the memory device 300, including managing the main memory 302 and handling communications between the memory device 300 and the host device 308. In some embodiments, the control circuitry 306 can include embedded memory with memory registers for storing, e.g., memory addresses, row counters, bank counters, memory pointers, fetched data, etc. In another embodiment of the present technology, a memory device 300 may not include control circuitry, and may instead rely upon external control (e.g., provided by the host device 308, or by a processor or controller separate from the memory device 300).

The host device 308 can be any one of a number of electronic devices capable of utilizing memory for the temporary or persistent storage of information, or a component thereof. For example, the host device 308 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 308 may be a networking device (e.g., a switch, a router, etc.) or a recorder of digital images, audio and/or video, a vehicle, an appliance, a toy, or any one of a number of other products. In one embodiment, the host device 308 may be connected directly to memory device 300, although in other embodiments, the host device 308 may be indirectly connected to memory device (e.g., over a networked connection or through intermediary devices).

In operation, the control circuitry 306 can directly write or otherwise program (e.g., erase) the various memory regions of the main memory 302. The control circuitry 306 communicates with the host device 308 over a host-device bus or interface 310. In some embodiments, the host device 308 and the control circuitry 306 can communicate over a dedicated memory bus (e.g., a DRAM bus). In other embodiments, the host device 308 and the control circuitry 306 can communicate over a serial interface, such as a serial attached SCSI (SAS), a serial AT attachment (SATA) interface, a peripheral component interconnect express (PCIe), or other suitable interface (e.g., a parallel interface). The host device 308 can send various requests (in the form of, e.g., a packet or stream of packets) to the control circuitry 306. A request can include a command to read, write, erase, return information, and/or to perform a particular operation (e.g., a refresh operation, a TRIM operation, a precharge operation, an activate operation, a wear-leveling operation, a garbage collection operation, etc.).

In some embodiments, the memory device 300 may receive a command directed to a first data set from the host device 308 coupled with the memory device 300. The first data set may refer to external data that the host provides (if the command corresponds to a write command) or the external data written in the memory array 150 (if the command corresponds to a read command). The memory device 300 may generate a second data set from the first data set, where the second data set includes one or more bits inverted (e.g., corrupted, poisoned) corresponding to one or more bit locations that the host device has indicated to the memory device 300 (e.g., via multi-purpose commands, MRW commands, or any command which writes the register 315 of the memory device 300). The second data set may refer to the code word generated based on the external data (if the command corresponds to a write command) or the code word read from the memory array (if the command corresponds to the read command). Subsequently, the memory device 300, in conjunction with the on-die ECC circuit, may detect one or more errors based on the one or more bits inverted in the second data set. Subsequently, the memory device 300, in conjunction with the on-die ECC circuit, may correct the one or more errors, thereby generating the first data set with the poison removed, and transmit the first data set to the host device. In this manner, the host device 308 may test the on-die ECC circuit to validate (confirm) its functionality, by controlling which bits to poison during write operations or read operations, and receiving the data without the poison from the memory device 300.

Figure 4:
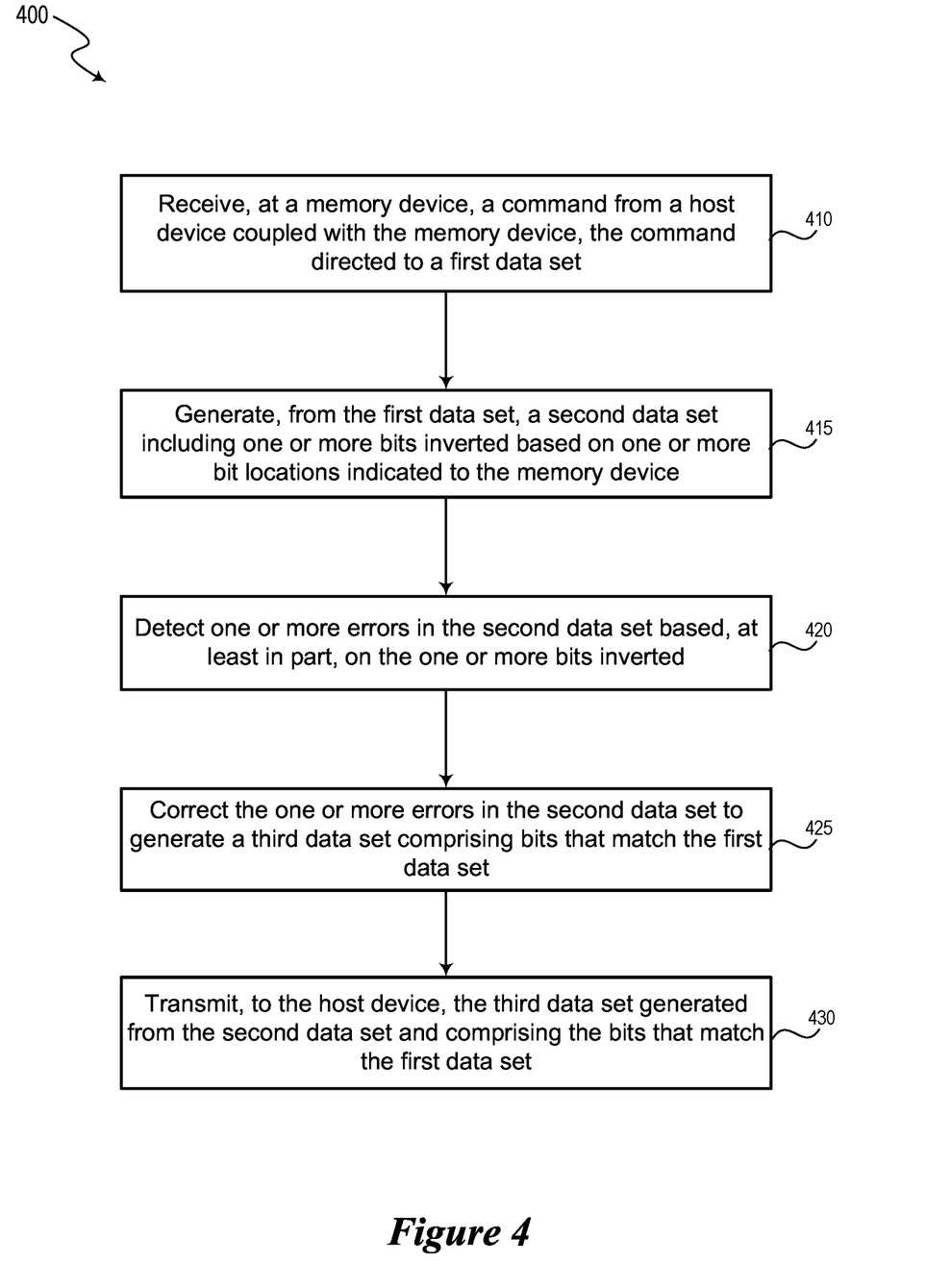
FIGS. 4 and 5 are flowcharts illustrating methods of operating a memory device in accordance with embodiments of the present technology.

FIG. 4 is a flow chart 400 illustrating a method of operating a memory device in accordance with embodiments of the present technology. The flow chart 400 may be an example of or include aspects of a method that the memory device (e.g., the peripheral circuitry 215, the control circuitry 306) may perform as described with reference to FIGS. 1 through 3. The flow chart 400 may include aspects of checking on-die ECC functionality as described with FIGS. 2A and 2B.

The method includes receiving, at a memory device, a command from a host device coupled with the memory device, the command directed to a first data set (box 410). In accordance with one aspect of the present technology, the receiving feature of box 410 can be performed by the peripheral circuitry 215 (or the control circuitry 306), as described with reference to FIGS. 2A-2B and 3.

The method further includes generating, from the first data set, a second data set including one or more bits inverted based on one or more bit locations indicated to the memory device (box 415). In accordance with one aspect of the present technology, the generating feature of box 415 can be performed by the peripheral circuitry 215 (or the control circuitry 306), as described with reference to FIGS. 2A-2B and 3.

The method further includes detecting one or more errors in the second data set based, at least in part, on the one or more bits inverted (box 420). In accordance with one aspect of the present technology, the detecting feature of box 420 can be performed by the peripheral circuitry 215 (or the control circuitry 306), in conjunction with the ECC circuit 225, as described with reference to FIGS. 2A-2B and 3.

The method further includes correcting the one or more errors in the second data set to generate a third data set comprising bits that match the first data set (box 425). In accordance with one aspect of the present technology, the correcting feature of box 425 can be performed by the peripheral circuitry 215 (or the control circuitry 306), in conjunction with the ECC circuit 225, as described with reference to FIGS. 2A-2B and 3.

The method further includes transmitting, to the host device, the third data set generated from the second data set and comprising the bits that match the first data set (box 430). In accordance with one aspect of the present technology, the transmitting feature of box 430 can be performed by the peripheral circuitry 215 (or the control circuitry 306), as described with reference to FIGS. 2A-2B and 3.

In some embodiments, one or more registers of the memory device are programmed by the host device to include the one or more bit locations, prior to receiving the command. In some embodiments, the one or more bit locations are indicated to the memory device through one or more commands to program a register of the memory device transmitted from the host device to the memory device, prior to receiving the command. In some embodiments, the command corresponds to a write command providing the first data set, and generating the second data set from the first data set further comprises calculating error correcting code (ECC) check bits using the first data set, where the second data set includes the first data set and the ECC check bits, and inverting the one or more bits of the second data set corresponding to the one or more bit locations.

In some embodiments, the method can further include writing the second data set to a memory array of the memory device, the write command including an address of the memory array to write the second data set. In some embodiments, the method can further include receiving a read command from the host device, the read command including the address, and reading, in response to receiving the read command, the second data set from the memory array, where detecting the one or more errors in the second data set corresponds to detecting the one or more errors in the second data set read from the memory array.

In some embodiments, the command corresponds to a read command reading the first data set from a memory array of the memory device, and generating the second data set from the first data set further comprises reading the first data set and a first group of ECC check bits from an address of the memory array included in the read command, the first group of ECC check bits calculated using the first data set, and inverting the one or more bits of the first data set and the first group of ECC check bits read from the memory array, the one or more bits corresponding to the one or more bit locations, where the second data set includes the first data set and the first group of ECC check bits with the one or more bits inverted.

In some embodiments, the method can further include calculating a second group of ECC check bits using the second data set, and comparing the first group of ECC check bits with the second group of ECC check bits. In some embodiments, detecting the one or more errors in the second data set is based, at least in part, on comparing the first group of ECC check bits with the second group of ECC check bits.

Figure 5:
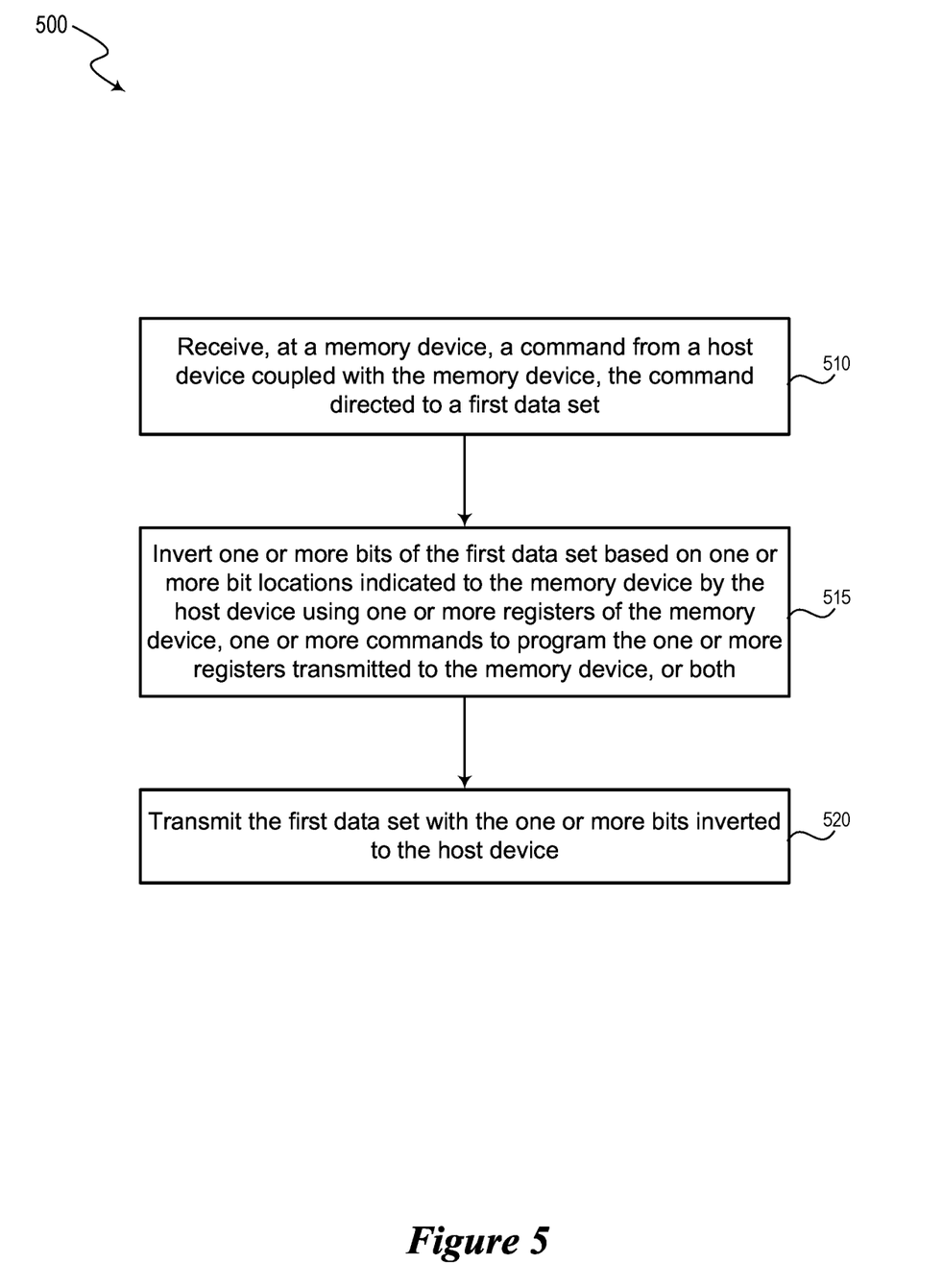

FIG. 5 is a flow chart 500 illustrating a method of operating a memory device in accordance with embodiments of the present technology. The flow chart 500 may be an example of or include aspects of a method that the memory device (e.g., the peripheral circuitry 215, the control circuitry 306) may perform as described with reference to FIGS. 1 through 3. The flow chart 500 may include aspects of providing poisoned data for checking system-level ECC functionality as described with FIGS. 2C and 2D.

The method includes receiving, at a memory device, a command from a host device coupled with the memory device, the command directed to a first data set (box 510). In accordance with one aspect of the present technology, the receiving feature of box 510 can be performed by the peripheral circuitry 215 (or the control circuitry 306), as described with reference to FIGS. 2C-2D and 3.

The method further includes inverting one or more bits of the first data set based on one or more bit locations indicated to the memory device by the host device using one or more registers of the memory device, one or more commands to program the one or more registers transmitted to the memory device, or both (box 515). In accordance with one aspect of the present technology, the inverting feature of box 515 can be performed by the peripheral circuitry 215 (or the control circuitry 306), as described with reference to FIGS. 2C-2D and 3.

The method further includes transmitting the first data set with the one or more bits inverted to the host device (box 520). In accordance with one aspect of the present technology, the transmitting feature of box 520 can be performed by the peripheral circuitry 215 (or the control circuitry 306), as described with reference to FIGS. 2C-2D and 3.

In some embodiments, the command corresponds to a write command providing the first data set, and the method can further include calculating a group of error correcting code (ECC) check bits using the first data set with the one or more bits inverted, and writing the first data set with the one or more bits inverted and the group of ECC check bits to an address of a memory array of the memory device, the write command including the address. In some embodiments, the method can further include receiving, after writing the first data set with the one or more bits inverted to the address, a read command from the host device, the read command including the address, and reading, in response to receiving the read command, the first data set with the one or more bits inverted from the memory array, where transmitting the first data set with the one or more bits inverted corresponds to transmitting the first data set with the one or more bits inverted read from the memory array. In some embodiments, the group of ECC check bits is a first group of ECC check bits, and the method can further include calculating a second group of ECC check bits using the first data set with the one or more bits inverted read from the memory array, and comparing the first group of ECC check bits and the second group of ECC check bits, prior to transmitting the first data set with the one or more bits inverted to the host device.

In some embodiments, the command corresponds to a read command reading the first data set from a memory array of the memory device, and the method can further include reading the first data set and a first group of ECC check bits from an address of the memory array included in the read command, the first group of ECC check bits calculated using the first data set, calculating a second group of ECC check bits using the first data set read from the memory array, and comparing the first group of ECC check bits with the second group of ECC check bits. In some embodiments, inverting the one or more bits of the first data set corresponds to inverting the one or more bits of the first data set read from the memory array, after comparing the first group of ECC check bits with the second group of ECC check bits.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method, comprising:
   receiving, at a memory device, a command from a host device coupled with the memory device, the command directed to a first data set;
   generating, from the first data set, a second data set by inverting one or more bits of the first data set, wherein inverting the one or more bits of the first data set is based at least in part on one or more predetermined poisoned bit locations indicated to the memory device;
   detecting one or more errors in the second data set based, at least in part, on the one or more inverted bits;
   correcting the one or more errors in the second data set to generate a third data set comprising bits that match the first data set; and
   transmitting, to the host device, the third data set generated from the second data set and comprising the bits that match the first data set.

2. The method of claim 1, wherein one or more registers of the memory device are configured to store the one or more predetermined poisoned bit locations.

3. The method of claim 1, wherein the one or more predetermined poisoned bit locations are indicated to the memory device through one or more commands to program a register of the memory device transmitted from the host device to the memory device, prior to receiving the command.

4. The method of claim 1, wherein the command corresponds to a write command providing the first data set, and generating the second data set from the first data set further comprises:
   calculating error correcting code (ECC) check bits using the first data set, wherein the second data set includes the first data set and the ECC check bits; and
   inverting the one or more bits of the second data set corresponding to the one or more predetermined poisoned bit locations.

5. The method of claim 4, further comprising:
   writing the second data set to a memory array of the memory device, the write command including an address of the memory array to write the second data set.

6. The method of claim 5, further comprising:
   receiving a read command from the host device, the read command including the address; and
   reading, in response to receiving the read command, the second data set from the memory array, wherein detecting the one or more errors in the second data set corresponds to detecting the one or more errors in the second data set read from the memory array.

7. The method of claim 1, wherein the command corresponds to a read command reading the first data set from a memory array of the memory device, and generating the second data set from the first data set further comprises:
   reading the first data set and a first group of ECC check bits from an address of the memory array included in the read command, the first group of ECC check bits calculated using the first data set; and
   inverting the one or more bits of the first data set and the first group of ECC check bits read from the memory array, the one or more bits corresponding to the one or more predetermined poisoned bit locations, wherein the second data set includes the first data set and the first group of ECC check bits with the one or more inverted bits.

8. The method of claim 7, further comprising:
calculating a second group of ECC check bits using the second data set; and
comparing the first group of ECC check bits with the second group of ECC check bits.

9. The method of claim 8, wherein detecting the one or more errors in the second data set is based, at least in part, on comparing the first group of ECC check bits with the second group of ECC check bits.

10. A method, comprising:
receiving, at a memory device, a command from a host device coupled with the memory device, the command directed to a first data set;
inverting one or more bits of the first data set based on one or more predetermined poisoned bit locations indicated to the memory device; and
transmitting the first data set with the one or more inverted bits to the host device.

11. The method of claim 10, wherein the command corresponds to a write command providing the first data set, the method further comprising:
calculating a group of error correcting code (ECC) check bits using the first data set with the one or more inverted bits; and
writing the first data set with the one or more inverted bits and the group of ECC check bits to an address of a memory array of the memory device, the write command including the address.

12. The method of claim 11, further comprising:
receiving, after writing the first data set with the one or more inverted bits to the address, a read command from the host device, the read command including the address; and
reading, in response to receiving the read command, the first data set with the one or more inverted bits from the memory array, wherein transmitting the first data set with the one or more inverted bits corresponds to transmitting the first data set with the one or more inverted bits read from the memory array.

13. The method of claim 12, wherein the group of ECC check bits is a first group of ECC check bits, the method further comprising:
calculating a second group of ECC check bits using the first data set with the one or more inverted bits read from the memory array; and
comparing the first group of ECC check bits and the second group of ECC check bits, prior to transmitting the first data set with the one or more inverted bits to the host device.

14. The method of claim 10, wherein the command corresponds to a read command reading the first data set from a memory array of the memory device, the method further comprising:
reading the first data set and a first group of ECC check bits from an address of the memory array included in the read command, the first group of ECC check bits calculated using the first data set;
calculating a second group of ECC check bits using the first data set read from the memory array; and
comparing the first group of ECC check bits with the second group of ECC check bits.

15. The method of claim 14, wherein inverting the one or more bits of the first data set corresponds to inverting the one or more bits of the first data set read from the memory array, after comparing the first group of ECC check bits with the second group of ECC check bits.

16. An apparatus, comprising:
a memory array; and
peripheral circuitry coupled with the memory array, the peripheral circuitry configured to:
receive a command from a host device coupled with the apparatus, the command directed to a first data set;
generate, from the first data set, a second data set by inverting one or more bits of the first data set, wherein inverting the one or more bits of the first data set is based at least in part on one or more predetermined poisoned bit locations indicated to the apparatus; and
transmitting, to the host device, the second data set.

17. The apparatus of claim 16, further comprising:
one or more registers configured to store the one or more predetermined poisoned bit locations.

18. The apparatus of claim 16, further comprising:
a command decoder configured to determine the one or more predetermined poisoned bit locations based, at least in part, on one or more commands to program a register of the apparatus transmitted from the host device.

19. The apparatus of claim 16, wherein the peripheral circuitry is further configured to:
calculate error correcting code (ECC) check bits using the first data set provided with a write command from the host device, wherein the second data set includes the first data set and the ECC check bits; and
invert the one or more bits of the second data set corresponding to the one or more predetermined poisoned bit locations.

20. The apparatus of claim 16, wherein the peripheral circuitry is further configured to:
read the first data set and a first group of ECC check bits from an address of the memory array included in a read command from the host device, the first group of ECC check bits calculated using the first data set; and
invert the one or more bits of the first data set and the first group of ECC check bits read from the memory array, the one or more bits corresponding to the one or more predetermined poisoned bit locations, wherein the second data set includes the first data set and the first group of ECC check bits with the one or more bits inverted.

* * * * *